United States Patent [19]
Kim

[11] Patent Number: 5,895,940
[45] Date of Patent: Apr. 20, 1999

[54] INTEGRATED CIRCUIT BUFFER DEVICES HAVING BUILT-IN ELECTROSTATIC DISCHARGE PROTECTION THYRISTORS

[75] Inventor: Dae-Gyu Kim, Kyunggi-do, Rep. of Korea

[73] Assignee: Samsung Electronics Co., Ltd., Kyungki-do, Rep. of Korea

[21] Appl. No.: 09/025,122

[22] Filed: Feb. 17, 1998

[30] Foreign Application Priority Data

Feb. 17, 1997 [KR] Rep. of Korea ............ 97-4643

[51] Int. Cl.$^6$ ............................ H01L 29/74; H01L 29/76
[52] U.S. Cl. .............................. 257/173; 257/371
[58] Field of Search ............................ 257/355–363, 257/546, 547, 173, 140, 146, 371, 372

[56] References Cited

U.S. PATENT DOCUMENTS

| | | | |
|---|---|---|---|
| 4,692,781 | 9/1987 | Rountree et al. | 357/23.13 |
| 4,952,994 | 8/1990 | Lin | 357/23.13 |
| 5,166,089 | 11/1992 | Chen et al. | 437/51 |
| 5,229,635 | 7/1993 | Bessolo et al. | 257/360 |
| 5,281,842 | 1/1994 | Yasuda et al. | 257/371 |
| 5,290,724 | 3/1994 | Leach | 437/51 |
| 5,293,055 | 3/1994 | Hara et al. | 257/371 |
| 5,404,041 | 4/1995 | Diaz et al. | 257/360 |
| 5,450,267 | 9/1995 | Diaz et al. | 361/56 |
| 5,452,171 | 9/1995 | Metz et al. | 361/56 |
| 5,468,667 | 11/1995 | Diaz et al. | 437/50 |
| 5,689,132 | 11/1997 | Ichikawa | 257/360 |
| 5,786,617 | 7/1998 | Merrill et al. | 257/371 |

OTHER PUBLICATIONS

Ham, ESD protection circuit formed in a minimized area, application #08/963,105, Nov. 3, 1997.

*Primary Examiner*—Tom Thomas
*Assistant Examiner*—Ori Nadav
*Attorney, Agent, or Firm*—Myers Bigel Sibley & Sajovec

[57] ABSTRACT

Integrated circuits having built-in electrostatic discharge protection thyristors include a semiconductor substrate with well regions of predetermined conductivity type therein which enable the formation of pairs of built-in thyristors which provided overvoltage protection. The substrate preferably contains first and second well regions of first and second conductivity type, respectively, at spaced locations, and third and fourth well regions of second and first conductivity type, respectively, which form respective P-N junctions with the first and second well regions. A first pair of guard regions of opposite conductivity type is also formed in the third well region, and this first pair of guard regions is electrically coupled to a first reference potential. In addition, a second pair of guard regions of opposite conductivity type is formed in the fourth well region and this pair of guard regions is electrically connected to a second reference potential. A semiconductor region of second conductivity type is also formed in the first well region and a semiconductor region of first conductivity type is formed in the second well region. Finally, a first guard ring of first conductivity type is formed in the first well region and a second guard ring of second conductivity type is formed in the second well region to complete the structures of a pair of thyristors. Here, the first guard ring is preferably electrically connected to the second reference potential and the second guard ring is electrically connected to the first reference potential. An input/output (I/O) pad is also electrically coupled to the semiconductor regions of first and second conductivity type, so that damage caused by excessive voltage can be inhibited upon latch-up of the built-in thyristors.

20 Claims, 5 Drawing Sheets

INTEGRATED CIRCUIT BUFFER DEVICES HAVING BUILT-IN ELECTROSTATIC DISCHARGE PROTECTION THYRISTORS

FIELD OF THE INVENTION

The present invention relates to integrated circuit semiconductor devices, and more particularly to integrated circuit semiconductor devices having electrostatic discharge (ESD) circuits therein.

BACKGROUND OF THE INVENTION

Electrostatic discharge and electrical overstress account for more than fifty (50) percent of the field related failures in integrated circuits. Accordingly, electrostatic discharge (ESD) and electrical overstress (EOS) protection circuitry plays an important role in the design, layout and testing of integrated circuits (IC) because many of the functional circuit elements on state-of-the-art integrated circuits are susceptible to high voltages caused by, among other things, electrostatic build-up of charge. This is especially true for complementary metal oxide semiconductor (CMOS) based integrated circuits because in high density CMOS circuits, high voltages caused by electrostatic build-up can destroy gate oxides associated with individual transistors and logic gates. To protect against these types of failures, many attempts have been made to develop ESD and EOS protection devices.

One such attempt is disclosed in U.S. Pat. No. 4,692,781 to Rountree et al. entitled Semiconductor Device with Electrostatic Discharge Protection, assigned to Texas Instruments, Inc. The '781 patent discloses an input protection circuit containing a thick-oxide transistor connected between a metal I/O pad and ground. The spacing between the metal-to-silicon drain contact and the channel of this transistor is made large so that the metal drain contact will not be melted by heat propagated along the silicon surface during a current spike caused by an ESD event. U.S. Pat. No. 4,952,994 to Lin entitled Input Protection Arrangement for VLSI Integrated Circuit Devices, assigned to Digital Equipment Corp., also discloses an input protection circuit for diverting electrostatic discharge current away from functional circuit elements which are connected to I/O pads on an integrated circuit chip. The input protection circuit comprises a MOS transistor having a gate electrode and a field oxide insulating layer capable of sustaining high voltages. Other attempts to develop ESD/EOS protection circuits are also disclosed in U.S. Pat. Nos. 5,404,041, 5,450,267 and 5,468,667 to C. H. Diaz, C. Duvvury and S. M. Kang. In particular, the '041 and '667 patents disclose MOS-type ESD/EOS protection devices with source and drain contact spacings that are designed to increase the failure threshold of the protection devices. In addition, the '267 patent discloses an ESD/EOS protection circuit including both MOS and bipolar transistors.

U.S. Pat. No. 5,452,171 to Metz et al. entitled Electrostatic Discharge Protection Circuit for Integrated Circuits, also discloses an ESD protection circuit which uses SCR latch-up current to divert ESD pulse current away from sensitive CMOS circuit structures. The disclosed circuit uses an inverter trigger device, with a voltage divider on its output, to control the amount of voltage necessary to cause latch-up. The disclosed protection circuit also allows the threshold voltage at which latch-up occurs to be adjusted by varying the sizes of the transistors used in the voltage divider.

Notwithstanding these attempts to prevent failures caused by electrostatic discharge and electrical overstress faults using ESD/EOS protection circuits, there continues to be a need for improved electrostatic discharge protection devices.

SUMMARY OF THE INVENTION

It is therefore an object of the present invention to provide integrated circuits having improved electrostatic discharge capability.

It is another object of the present invention to provide electrostatic discharge devices that are built into output driver circuits.

These and other objects, features and advantages of the present invention are provided by integrated circuits having preferred electrostatic discharge capability. The electrostatic discharge capability is provided by built-in thyristors that are capable of entering a highly conductive regenerative mode of operation (e.g., latch-up) during electrostatic discharge events, and prevent high voltage levels from being sustained at the input/output pads of the integrated circuit. In particular, an integrated circuit having electrostatic discharge capability comprises a semiconductor substrate with well regions of predetermined conductivity type therein which enable the formation of pairs of built-in thyristors that provide overvoltage and undervoltage protection to active devices formed in and/or adjacent the well regions. In particular, the substrate contains first and second well regions of first and second conductivity type, respectively, at spaced locations, and third and fourth well regions of second and first conductivity type, respectively, which form respective P-N junctions with the first and second well regions. A first pair of guard regions of opposite conductivity type is also formed in the third well region, and this first pair of guard regions is electrically coupled to a first reference potential (e.g., Vss). In addition, a second pair of guard regions of opposite conductivity type is formed in the fourth well region and this pair of guard regions is electrically connected to a second reference potential (e.g., Vdd). A semiconductor region of second conductivity type (e.g., a drain region of a PMOS device) is also formed in the first well region and a semiconductor region of first conductivity type (e.g., a drain region of an NMOS device) is formed in the second well region. Finally, a first guard ring of first conductivity type (e.g., N-type) is formed in the first well region and a second guard ring of second conductivity type is formed in the second well region. Here, the first guard ring is preferably electrically connected to the second reference potential (e.g., Vdd) and the second guard ring is electrically connected to the first reference potential (e.g., Vss). An input/output (I/O) pad is also electrically coupled to the semiconductor regions of first and second conductivity type, so that the occurrence of excessively low or high voltages on the I/O pad can be prevented by the occurrence of latch-up in at least one of the built-in thyristors.

According to one embodiment of the present invention, the built-in thyristors provide overvoltage output protection. Here, a first insulated gate field effect transistor (e.g., PMOS) is formed on the first well region and a second insulated gate field effect transistor (e.g., NMOS) is formed on the second well region. The first insulated gate field effect transistor is surrounded by the first guard ring and the second insulated gate field effect transistor is surrounded by the second guard ring. According to this embodiment of the present invention, the semiconductor regions of second and first conductivity type constitute drain regions of the first and second insulated gate field effect transistors, respectively. The first and second insulated gate field effect transistors may collectively form a CMOS inverter having an output electrically coupled to the input/output pad. According to another embodiment of the present invention, the built-in thyristors provide overvoltage input protection. Here, an input pad is electrically connected to the semiconductor regions of first and second conductivity type and a CMOS inverter has an input electrically coupled to the input pad.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 1:
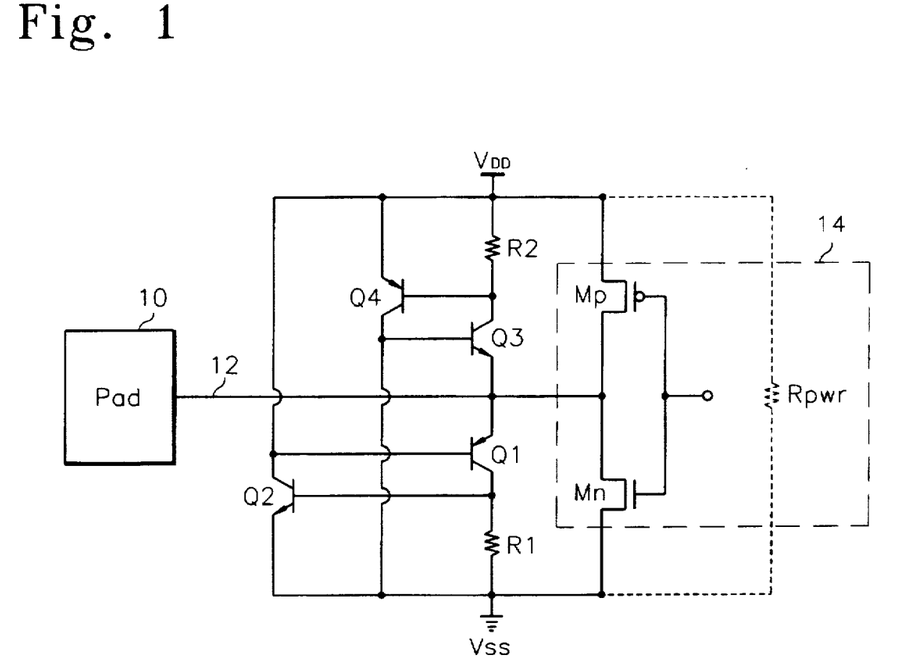
FIG. 1 is an electrical schematic of a CMOS output driver having built-in electrostatic discharge protection circuits, according to a first embodiment of the present invention.

FIG. 1 shows a preferred built-in protection circuit to prevent an integrated circuit having CMOS output drivers therein from excessive voltages generated by electrostatic discharge (ESD) or related parasitic events. Referring to FIG. 1, an output pad 10 is electrically connected, via a conductive line 12, to the output terminal of a CMOS output driver 14 contained within an integrated circuit. The emitter terminal of the PNP transistor Q1 is connected to the conductive line 12, while its base terminal also constitutes the collector terminal of the NPN transistor Q2. Also, the collector terminal of the PNP transistor Q1 is connected to the base terminal of NPN transistor Q2 and is also connected via a resistor R1 to a ground potential Vss. The emitter terminal of transistor Q2 is also connected to a ground potential Vss, while its collector terminal is connected to a supply potential Vdd. The cross-coupled transistors Q1 and Q2 form a first built-in thyristor or SCR.

The emitter terminal of the NPN transistor Q3 is connected to the conductive line 12, while its base terminal is connected to the collector terminal of the PNP transistor Q4. Also, the collector terminal of NPN transistor Q3 is connected to the base terminal of transistor Q4 and at the same time is connected, via a resistor R2, to the supply potential Vdd. The emitter terminal of PNP transistor Q4 is connected to the supply potential Vdd, while its collector terminal is connected to the ground potential Vss. The cross-coupled transistors Q3 and Q4 form a second built-in thyristor. The resistor $R_{pwr}$ extending between Vdd and Vss, represents the effective body resistance of the integrated circuit. Accordingly, leakage currents between Vdd and Vss may be generated in the integrated circuit and the magnitude of these currents is a function of the magnitude of the supply potential and the effective body resistance, as will be understood by those skilled in the art. As described more fully hereinbelow, the first and second built-in thyristors can be triggered (i.e., turned-on) upon the occurrence of an ESD event to protect the integrated circuit.

Figure 2:
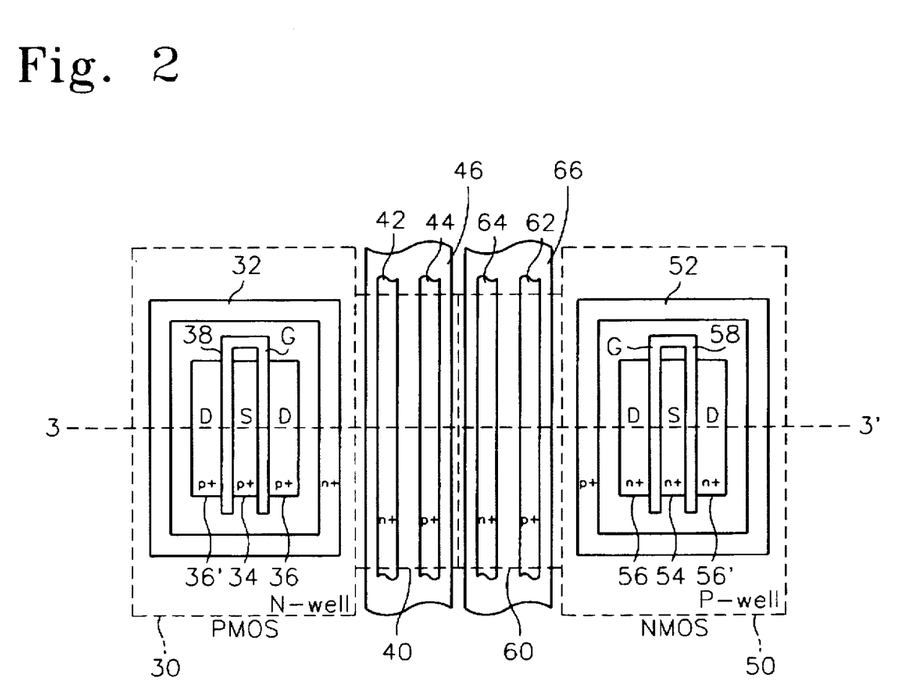
FIG. 2 is a preferred layout schematic of the CMOS output driver of FIG. 1.

FIG. 2 shows a layout of preferred CMOS output buffer device having the ESD protection circuit shown in FIG. 1 incorporated therein. In FIG. 2, reference numerals 30 and 50 denote the N-well for the PMOS transistor and the P-well for the NMOS transistor, respectively. The above wells 30 and 50 are designed to be spaced-apart in a semiconductor substrate at a predetermined distance. P-well 40 and N-well 60 are formed to extend between the above wells 30 and 50, as illustrated. A heavily-doped N+ region 32 is defined as a guard-ring for the well bias extending in the N-well 30 for the PMOS transistor, as illustrated. One P+ source region 34 and two P+ drain regions 36 and 36' are arranged within the guard-ring 32. A C-shaped gate region 38 is also defined between the source and drain regions, as illustrated. The NMOS transistor has a similar layout to the PMOS transistor, however, its guard-ring 52 is formed as a P+ region, while source and drain regions 54, 56 and 56' are formed as N+ regions. The NMOS transistor also includes a C-shaped gate electrode 58. Referring still to FIG. 2, N+ guard region 42 and P+ guard region 44 may be formed as stripe-shaped regions which extend in parallel in P-well 40. Similarly, N+ guard region 64 and P+ guard region 62 can also be formed as stripe-shaped regions which extend in parallel in N-well 60. Metal lines 46 and 66 may also overlap the P-well and N-well regions 40 and 60.

Figure 3:
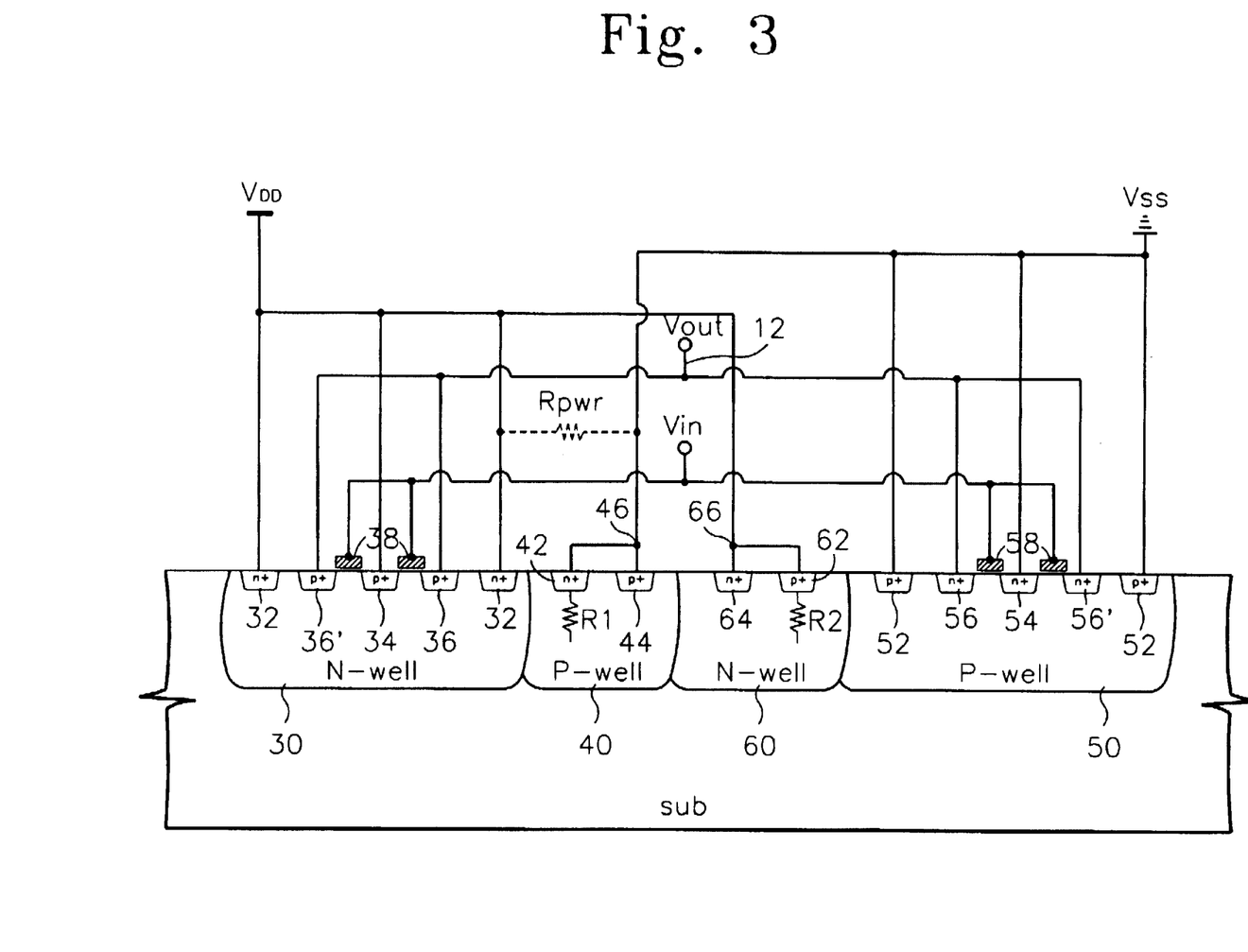
FIG. 3 is a cross-sectional view of the CMOS output driver of FIG. 2, taken along line 3—3'.

A cross-sectional view of the CMOS output buffer device taken along line 3—3' of FIG. 2, is illustrated in FIG. 3. Referring to FIG. 3, the heavily-doped regions (i.e., guard-rings, source and drain regions) are formed at the surface of the well regions 30–60. As illustrated, the guard-ring 32 of the PMOS transistor is connected to the supply potential Vdd and the source 34 of the PMOS transistor is also connected to the supply potential Vdd. Also, drains 36 and 36' of the PMOS transistor are connected to the conductive line 12. Guard regions 42 and 44 within the P-well 40 are connected to the ground potential Vss. The guard-ring 52 and source 54 of the NMOS transistor are connected to the ground potential Vss. Also, drains 56 and 56' of the NMOS transistor are connected to the conductive line 12. The supply potential Vdd is also applied to the P+ and N+ guard regions 62 and 64 within N-well 60.

According to this preferred configuration of well regions and highly doped regions, P+ doping region 36 within the N-well 30 forms an emitter of the PNP bipolar junction transistor Q1 in FIG. 1. The base of the bipolar transistor Q1 is formed by the N-well 30. P-well 40 and its internal P+ doping guard region 44 form a collector of the transistor Q1. N+ doping region 42 within the P-well 40 forms an emitter of the NPN bipolar junction transistor Q2 in FIG. 1. The base of the bipolar transistor Q2 is formed by P-well 40.

N-well 30 and its internal N+ doping region 32 form a collector of the transistor Q2. P-well 40 constitutes both a collector of the transistor Q1 and a base of the transistor Q2, and at the same time forms a resistor R1. As will be understood by those skilled in the art, the N-well 30 and P-well 40 regions and the N+ and P+ regions in these well regions collectively form a first built-in thyristor.

N+ doping region 56 within the P-well 50 forms an emitter of the NPN bipolar junction transistor Q3 in FIG. 1. The base of the bipolar transistor Q3 is formed by the P-well 50. N-well 60 and its internal N+ doping region 64 collectively form a collector of the transistor Q3. P+ guard region 62 within the N-well 60 forms an emitter of the PNP bipolar junction transistor Q4 in FIG. 1. The base of the bipolar transistor Q4 is formed by N-well 60. P-well 50 and its internal P+ doping region 52 collectively form a collector of the transistor Q4. N-well 60 constitutes both the collector of the transistor Q3 and the base of transistor Q4 and at the same time forms a resistor R2. As will be understood by those skilled in the art, the P-well 50, N-well 60 and the P+ and N+ regions in these well regions collectively form a second built-in thyristor.

The operation of the built-in ESD protection thyristors according to a first embodiment of the present invention will now be described. In particular, when an excessive positive voltage is applied to the output pad 10 or conductive line 12 upon occurrence of an ESD fault, the junction between the emitter 36 and base 30 of transistor Q1 becomes forward-biased. Hence, current flows via the P+ region 36, N-well 30 and N+ region 32 to the supply potential Vdd. Therefore, the leakage current $I_{dd}$, which flows from the potential Vdd to the ground potential Vss via the body resistance $R_{pwr}$, is increased. A collector current ($I_{C1}$) of the bipolar transistor Q1 is also induced. Here, $I_{C1}$, equals $\beta \cdot I_{dd}$ where $\beta$ is the current gain of the transistor Q1. When the collector current of the transistor Q1 flows toward the P-well 40, a relatively large voltage drop may occur in the P-well 40 because of the P-well resistance R1. Thus, when an excessive positive voltage is applied to the pad 10 or conductive line 12, the voltage at both sides of the resistor R1 becomes increased. This increase in voltage induces the injection of electrons from the N+ emitter region 42 of the bipolar transistor Q2 to the P-well 40.

As will be understood by those skilled in the art, this injection of electrons induces further hole injection from the P+ emitter region 36 of the PNP transistor Q1 toward the P-well 40. Such additional injection causes the voltage at both sides of the resistor R1 to rapidly increase. As a result, the junction between the N+ emitter 42 and P-type base 40 of the bipolar transistor Q2 becomes forward-biased and causes triggering of the first thyristor consisting of regeneratively cross-coupled transistors Q1 and Q2. Once the first thyristor is triggered, the voltage across the thyristor snaps back and a large amount of current flows from the pad 10 (or conductive line 12) to the ground potential Vss, and this large current discharges the excessive voltage associated with a positive ESD voltage spike.

Now, when an excessively negative voltage is applied to the pad 10 or conductive line 12 in response to an ESD event, the junction between the N+ emitter 56 and P-type base 50 of the transistor Q3 becomes forward-biased. Hence, current flows via P+ region 52, P-well 50 and N+ emitter region 56, from the ground potential Vss to the conductive line 12. Therefore, the leakage current $-I_{dd}$ is increased. The collector current ($I_{C3}$) of the bipolar transistor Q3 is given by $\beta \cdot (-I_{dd})$, where $\beta$ is the current gain of the transistor Q3. When the collector current ($I_{C3}$) of the transistor Q3 flows towards the N-well 60, a relatively large voltage drop occurs in the N-well 60 because of the resistance R2 in the N-well 60. Moreover, when an excessively negative voltage is applied to the pad 10, the voltage at both sides of the resistor R2 is increased and the voltage induces the injection of holes from the P+ emitter 62 of the bipolar transistor Q4 into the N-well 60. Such injection of holes induces the injection of electrons from the N+ emitter 56 of the transistor Q3 toward the N-well 40. When this occurs, the voltage at both sides of the resistor R2 increases swiftly. Accordingly, the junction between the P+ emitter 62 and N-type base 60 of the bipolar transistor Q4 becomes forward-biased and triggers the second built-in thyristor formed by cross-coupled transistors Q3 and Q4. Once the second thyristor is triggered, the voltage across the thyristor snaps back and a significant regenerative current flows from the supply Vdd to the pad 10 and this large current discharges the excessive voltage associated with the negative ESD voltage spike.

Figure 4:
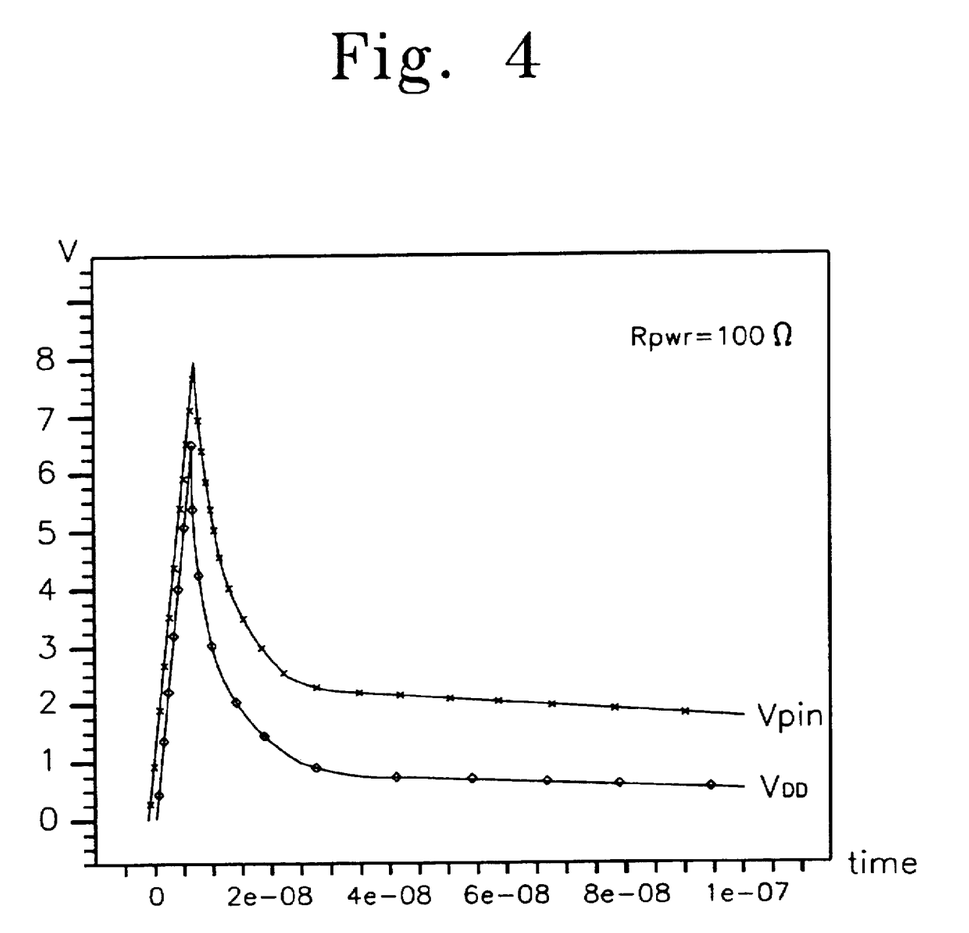
FIG. 4 is a graph illustrating a change in pad and supply voltages versus time, upon the occurrence of an electrostatic discharge event.

FIG. 4 is a graph which illustrates changes in a voltage Vpin of the output pad 10 and power supply voltage Vdd, when a positive ESD spike is applied to the output pad 10 of the device of FIG. 1 and $R_{pwr}$ is 100 ohms. Referring to FIG. 4, it can be seen that when the pin voltage Vpin reaches 8 V, the voltage snaps back and is lowered to about 2.3 V due to the latch-up or triggering of the first thyristor. Also, when the excessive positive voltage is applied, the supply voltage Vdd increases only up to about 6.5 V, instead of about 12 Volts if no ESD protection is provided.

Figure 5:
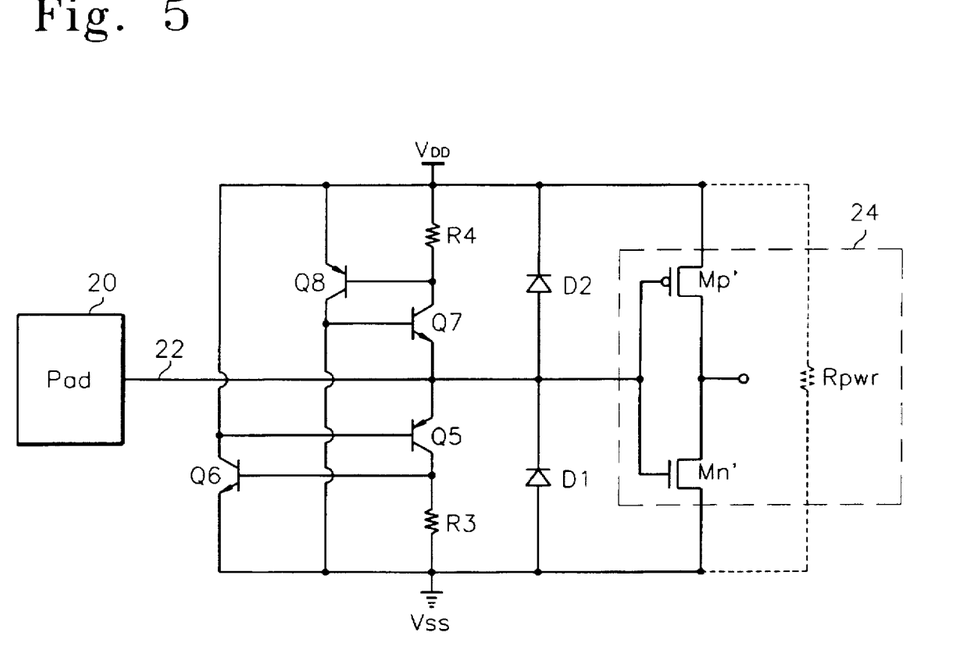
FIG. 5 is an electrical schematic of a CMOS input driver having built-in electrostatic discharge protection circuits electrically coupled thereto, according to a second embodiment of the present invention.

Referring now to FIG. 5, a CMOS input driver having built-in electrostatic discharge protection circuits therein according to a second embodiment of the present invention, is illustrated. According to this embodiment, an input pad 20 is electrically connected, via a conductive line 22, to the input terminal of a CMOS input driver/buffer 24 serving as an internal circuit. The emitter terminal of the PNP transistor Q5 is connected to the conductive line 22, while its base terminal is also the collector terminal of the NPN transistor Q6. The collector terminal of the PNP transistor Q5 is similarly connected to the base terminal of transistor Q6 and at the same time is connected via a resistor R3 to a ground potential Vss. The emitter terminal of the NPN transistor Q6 is connected to a ground potential Vss, while its collector terminal is connected to a supply potential Vdd. The cross-coupled bipolar transistors Q5 and Q6 form a first thyristor. The anode of diode D1 is connected to the ground potential Vss, while its cathode is connected to the conductive line 22. The emitter terminal of the NPN transistor Q7 is also connected to the conductive line 22, while its base terminal is connected to the collector terminal of the PNP transistor Q8. Also, the collector terminal of the PNP transistor Q7 is connected to the base terminal of PNP transistor Q8 and at the same time is connected via a resistance R4 to the supply potential Vdd. The emitter terminal of the PNP transistor 08 is connected to the supply potential Vdd, while its collector terminal is connected to the ground potential Vss. The cross-coupled transistors Q7 and Q8 also form a second thyristor. The anode of diode D2 is connected to the line 22, while its cathode is connected to the supply potential Vdd.

Figure 6:
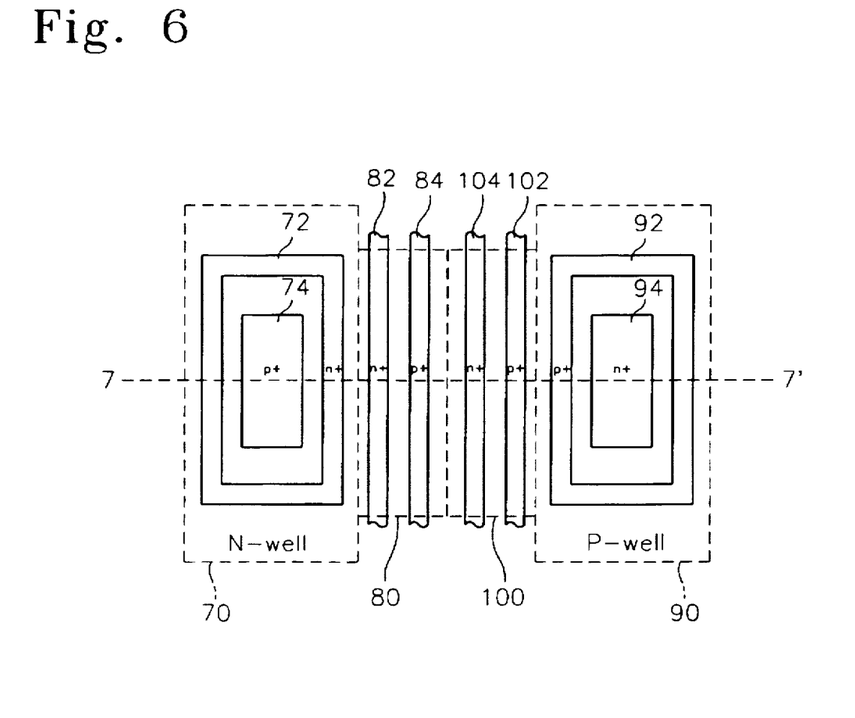
FIG. 6 is a preferred layout schematic of the electrostatic protection circuits of FIG. 5.

FIG. 6 illustrates a preferred layout schematic of the protection circuit of FIG. 5, however a layout of the CMOS inverter 24 is not shown in order to highlight the fact that this protection circuit can be used with any number of internal circuits. In FIG. 6, the reference numerals 70 and 90 refer to the N-well for diode D2 and the P-well for diode D1, respectively. The above wells 70 and 90 are preferably spaced-apart from each other, as illustrated. P-well 80 and N-well 100 regions are arranged between the above wells 70 and 90. The diodes D2 and D1 are formed in the N-well 70 and P-well 90. N+ region 72 is defined as a guard-ring for the well bias. One P+ source region 74 is formed within the guard-ring 72. P+ region 92 is also defined as a guard-ring in P-well 90. One N+ region 94 is formed within the guard-ring 92. N+ guard region 82 and P+ guard region 84 are formed in parallel in P-well 80 and these guard regions extend along a metal line (not shown). N+ guard region 104 and P+ guard region 102 are also formed in parallel in N-well 100.

Figure 7:
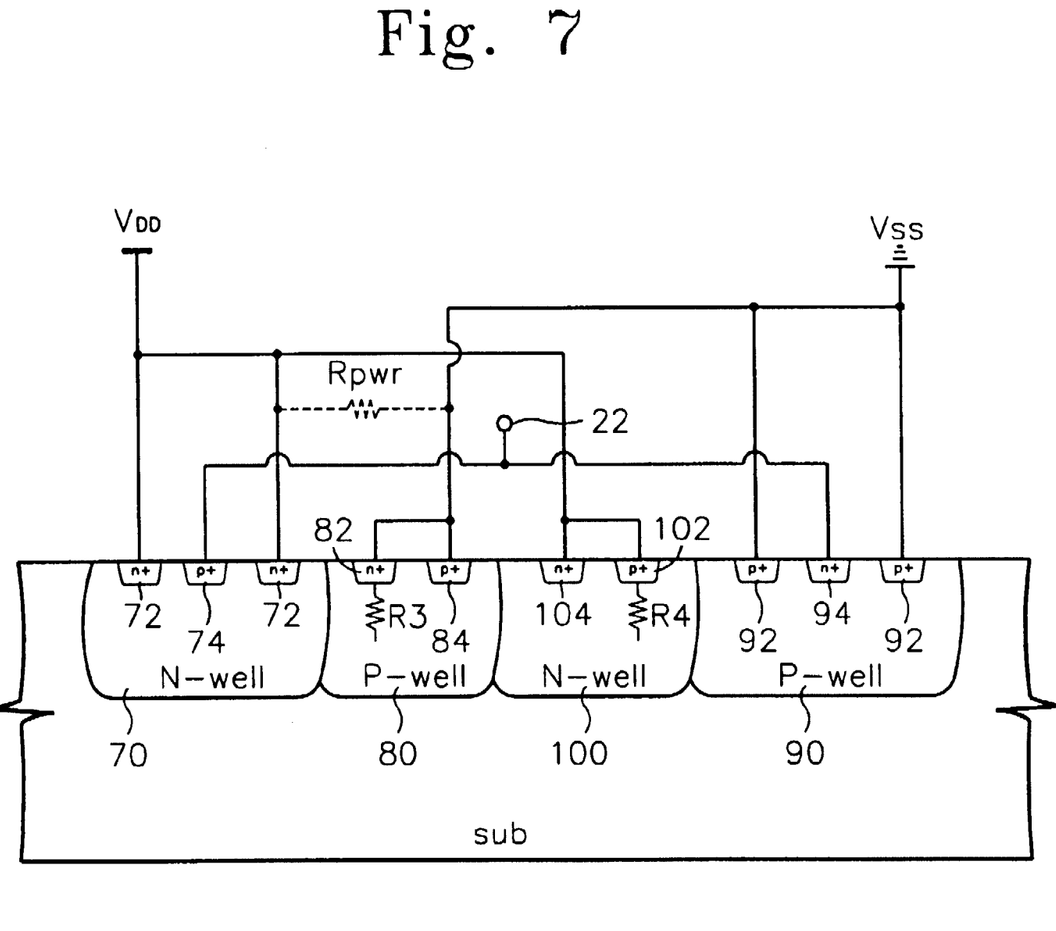
FIG. 7 is a cross-sectional view of the electrostatic protection circuits of FIG. 6, taken along line 7—7'.

A cross-sectional view of the ESD protection circuit of FIG. 6 taken along line 7—7', is illustrated in FIG. 7. Referring to FIG. 7, a guard-ring ring 72 which acts as the cathode of the diode D2 is connected to the supply potential Vdd, while P+ region 74 is connected to the conductive line 22 and operates as the anode of diode D2. Guard regions 82 and 84 within P-well 80 are connected to the ground potential Vss. A guard-ring 92 of diode D1 is connected to the ground potential Vss, while its N+ cathode region 94 is connected to the conductive line 22. Guard regions 102 and 104 within N-well 100 are connected to the supply potential Vdd.

P+ doping region 74 within the N-well 70 also forms an emitter of the PNP bipolar junction transistor Q5 in FIG. 5. The base of the PNP bipolar transistor Q5 is formed by the N-well 70. P-well 80 and its internal P+ guard region 84 form a collector of the transistor Q5. N+ doping region 82 within the P-well 80 forms an emitter of the NPN bipolar junction transistor Q6 in FIG. 5. The base of the NPN transistor Q6 is formed by the P-well 80. N-well 70 and its internal N+ doping region 72 form a collector of the NPN transistor Q6. P-well 80 forms a collector of the PNP transistor Q5 and a base of the NPN transistor Q6, respectively, and at the same time forms a resistor R3. The cross-coupled transistors Q5 and Q6 (and resistor R3) thereby form a thyristor. N+ doping region 94 within the P-well 90 also forms an emitter of the NPN bipolar junction transistor Q7. The base of the bipolar transistor Q7 is formed by the P-well 90. N-well 100 and its internal N+ doping region 104 form a collector of the NPN transistor Q7. P+ doping region 102 within the N-well 100 forms an emitter of the PNP transistor Q8. The base of the bipolar transistor Q8 is formed by N-well 100. P-well 90 and its internal P+ doping region 92 form a collector of the PNP transistor Q8. N-well 100 forms a collector of the transistor Q7 and a base of the transistor Q8 and at the same time forms a resistor R4. Thus, the cross-coupled transistors Q7 and Q8 (and resistor R4) form a second thyristor. The operation of these thyristors in reducing adverse consequences of ESD events is the same as the operation of the thyristors described with respect to FIGS. 1–4, and need not be further described.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit having electrostatic discharge capability, comprising:
    a semiconductor substrate containing therein first and second well regions of first and second conductivity type, respectively, at spaced locations, and third and fourth well regions of second and first conductivity type, respectively, which form respective P-N junctions with the first and second well regions;
    a first pair of guard regions of opposite conductivity type in the third well region, electrically coupled to a first reference potential;
    a second pair of guard regions of opposite conductivity type in the fourth well region, electrically connected to a second reference potential;
    a semiconductor region of second conductivity type in the first well region and forming a P-N junction therewith;
    a semiconductor region of first conductivity type in the second well region and forming a P-N junction therewith; and
    an input/output pad on the semiconductor substrate, electrically coupled to the semiconductor regions of first and second conductivity type.

2. The integrated circuit of claim 1, further comprising:
    a first guard ring of first conductivity type in the first well region and forming a non-rectifying junction therewith; and
    a second guard ring of second conductivity type in the second well region and forming a non-rectifying junction therewith.

3. The integrated circuit of claim 2, wherein the first guard ring is electrically connected to the second reference potential and the second guard ring is electrically connected to the first reference potential.

4. The integrated circuit of claim 2, further comprising a first insulated gate field effect transistor on the first well region and a second insulated gate field effect transistor on the second well region.

5. The integrated circuit of claim 3, wherein the third and fourth well regions form a P-N junction with each other.

6. The integrated circuit of claim 5, wherein the second conductivity type guard region in the first pair of guard regions forms a nonrectifying junction with the third well region; and wherein the first conductivity type guard region in the second pair of guard regions forms a nonrectifying junction with the fourth well region.

7. The integrated circuit of claim 6, wherein the first insulated gate field effect transistor is surrounded by the first guard ring; and wherein the second insulated gate field effect transistor is surrounded by the second guard ring.

8. The integrated circuit of claim 7, wherein the semiconductor regions of second and first conductivity type constitute drain regions of the first and second insulated gate field effect transistors, respectively.

9. The integrated circuit of claim 7, wherein the first and second insulated gate field effect transistors collectively form a CMOS inverter having an output electrically coupled to the input/output pad.

10. The integrated circuit of claim 7, wherein the first insulated gate field effect transistor comprises a PMOS transistor having a source region electrically coupled to the second reference potential; and wherein the second insulated gate field effect transistor comprises an NMOS transistor having a source region electrically coupled to the first reference potential.

11. An integrated circuit output driver having built-in electrostatic discharge protection thyristors, comprising:
    a semiconductor substrate containing therein first and second well regions of N-type and P-type conductivity, respectively, at spaced locations, and third and fourth well regions of P-type and N-type conductivity, respectively, which form respective P-N junctions with the first and second well regions;
    a first pair of stripe-shaped guard regions of opposite conductivity type in the third well region of P-type conductivity, electrically coupled to a first reference potential;
    a second pair of stripe-shaped guard regions of opposite conductivity type in the fourth well region of N-type conductivity, electrically connected to a second reference potential;

a semiconductor region of P-type conductivity type in the first well region of N-type conductivity;

a semiconductor region of N-type conductivity type in the second well region of P-type conductivity; and an output pad on the semiconductor substrate, electrically coupled to the P-type and N-type semiconductor regions.

12. The integrated circuit of claim 11, further comprising:

a first N-type guard ring in the first well region of N-type conductivity and forming a nonrectifying junction therewith; and a second P-type guard ring in the second well region of P-type conductivity and forming a nonrectifying junction therewith.

13. The integrated circuit of claim 12, wherein the first guard ring is electrically connected to the second reference potential and the second guard ring is electrically connected to the first reference potential.

14. The integrated circuit of claim 13, wherein the third and fourth wells regions form a P-N junction with each other.

15. The integrated circuit of claim 12, further comprising a PMOS transistor in the first well region and an NMOS transistor in the second well region.

16. The integrated circuit of claim 15, wherein the PMOS transistor is surrounded by the first guard ring; and wherein the NMOS transistor is surrounded by the second guard ring.

17. The integrated circuit of claim 16, wherein the PMOS and NMOS transistors each have drain regions which are electrically coupled to the output pad.

18. The integrated circuit of claim 16, wherein the PMOS and NMOS transistors collectively form a CMOS inverter having an output electrically coupled to the output pad.

19. The integrated circuit of claim 18, wherein the source region of the PMOS transistor is electrically connected to the second reference potential; and wherein the source region of the NMOS transistor is electrically connected to the first reference potential.

20. An integrated circuit having electrostatic discharge capability, comprising:

a semiconductor substrate containing therein first and second well regions of first and second conductivity type, respectively, at spaced locations, and third and fourth well regions of second and first conductivity type, respectively, which form respective P-N junctions with the first and second well regions;

a first pair of guard regions of opposite conductivity type in the third well region, electrically coupled to a first reference potential;

a second pair of guard regions of opposite conductivity type in the fourth well region, electrically connected to a second reference potential;

a semiconductor region of second conductivity type in the first well region and forming a P-N junction therewith;

a semiconductor region of first conductivity type in the second well region and forming a P-N junction therewith;

an input pad on the semiconductor substrate, electrically connected to the semiconductor regions of first and second conductivity type; and a CMOS inverter having an input electrically coupled to the input pad.

* * * * *